United States Patent
Colvin et al.

(10) Patent No.: US 11,699,565 B2
(45) Date of Patent: Jul. 11, 2023

(54) FLUORINE BASED MOLECULAR CO-GAS WHEN RUNNING DIMETHYLALUMINUM CHLORIDE AS A SOURCE MATERIAL TO GENERATE AN ALUMINUM ION BEAM

(71) Applicant: Axcelis Technologies, Inc., Beverly, MA (US)

(72) Inventors: Neil K. Colvin, Merrimack, NH (US); Neil Bassom, Hamilton, MA (US); Edward Moore, Newmarket, NH (US)

(73) Assignee: Axcelis Technologies, Inc., Beverly, MA (US)

( * ) Notice: Subject to any disclaimer, the term of this patent is extended or adjusted under 35 U.S.C. 154(b) by 63 days.

(21) Appl. No.: 17/514,302

(22) Filed: Oct. 29, 2021

(65) Prior Publication Data
US 2022/0139664 A1    May 5, 2022

Related U.S. Application Data

(60) Provisional application No. 63/107,729, filed on Oct. 30, 2020.

(51) Int. Cl.
*H01J 37/08*  (2006.01)
*H01J 37/317*  (2006.01)

(52) U.S. Cl.
CPC .......... *H01J 37/08* (2013.01); *H01J 37/3171* (2013.01); *H01J 2237/006* (2013.01); *H01J 2237/05* (2013.01)

(58) Field of Classification Search
CPC .... H01J 37/08; H01J 37/3171; H01J 37/3002; H01J 37/317; H01J 2237/05;
(Continued)

(56) References Cited

U.S. PATENT DOCUMENTS

2003/0122089 A1*  7/2003  Murrell .................. H01J 37/08
                                              250/425
2014/0357069 A1*  12/2014  Sinha ..................... H01J 37/08
                                              137/590
(Continued)

FOREIGN PATENT DOCUMENTS

CN      105655217 A      6/2016
WO      2014193867 A1    12/2014

OTHER PUBLICATIONS

International Search Report dated Mar. 2, 2022 for International Application No. PCT/US2021/057529.

*Primary Examiner* — David E Smith
*Assistant Examiner* — Hsien C Tsai
(74) *Attorney, Agent, or Firm* — Eschweiler & Potashnik, LLC

(57) ABSTRACT

An ion implantation system, ion source, and method are provided having a gaseous aluminum-based ion source material. The gaseous aluminum-based ion source material can be, or include, dimethylaluminum chloride (DMAC), where the DMAC is a liquid that transitions into vapor phase at room temperature. An ion source receives and ionizes the gaseous aluminum-based ion source material to form an ion beam. A low-pressure gas bottle supplies the DMAC as a gas to an arc chamber of the ion source by a primary gas line. A separate, secondary gas line supplies a co-gas, such as a fluorine-containing molecule, to the ion source, where the co-gas and DMAC reduce an energetic carbon cross-contamination and/or increase doubly charged aluminum.

20 Claims, 4 Drawing Sheets

(58) Field of Classification Search
CPC .......... H01J 2237/006; H01J 2237/022; H01J 2237/31701; H01L 21/265; H01L 21/67017
See application file for complete search history.

(56) References Cited

U.S. PATENT DOCUMENTS

2018/0346342 A1  12/2018  Colvin et al.
2019/0237290 A1   8/2019  Yuze et al.

\* cited by examiner

| Species (est) | DMAC + BF3 @ 85V ma | DMAC @ 85V ma |
|---|---|---|
| C+ | 0.0240 | 0.0202 |
| CH+ | 0.0004 | 0.0072 |
| HF+ | 0.0392 | 0.0000 |
| C2H2+ | 0.0027 | 0.0042 |
| CF+ | 0.0058 | 0.0000 |

FLUORINE BASED MOLECULAR CO-GAS WHEN RUNNING DIMETHYLALUMINUM CHLORIDE AS A SOURCE MATERIAL TO GENERATE AN ALUMINUM ION BEAM

REFERENCE TO RELATED APPLICATIONS

This application claims the benefit of U.S. Provisional Application Ser. No. 63/107,729 filed Oct. 30, 2020, the contents of all of which are herein incorporated by reference in their entirety.

FIELD

The present invention relates generally to ion implantation systems, and more specifically to an ion implantation system configured to generate an ion beam comprising aluminum ions from gaseous dimethylaluminum chloride (DMAC).

BACKGROUND

There is increasing demand for ion implants using metal ions. For example, aluminum implants are important for the power device market, which is a small but fast-growing segment of the market. For many metals, including aluminum, supplying feed material to the ion source is problematic. Systems have been previously provided that utilize a vaporizer, which is a small oven that is external to the arc chamber of the ion source, whereby metal salts are heated to produce adequate vapor pressure to supply vapor to the ion source. The oven, however, is remote from the arc chamber and takes time to heat up to the desired temperature, establish the vapor flow, start the plasma, start the ion beam, etc. Further, if a change from one metal species to some other species is desired, time is taken in waiting for the oven to cool down adequately for such a change in species.

Another conventional technique is to place a metal-containing material such as aluminum or another metal inside the arc chamber. For aluminum, the metal-containing material may comprise aluminum oxide, aluminum fluoride, or aluminum nitride, all of which can withstand the approximately 800 C temperatures of the plasma chamber. In such a system, ions are sputtered directly off the material in the plasma. Another technique is to use a plasma containing an etchant such as fluorine to attain chemical etching of the metal. While acceptable beam currents can be attained using these various techniques, compounds of aluminum oxide, aluminum chloride, and aluminum nitride, all of which are good electrical insulators, tend to be deposited on electrodes adjacent to the ion source in a relatively short period of time (e.g., 5-10 hours). As such, various deleterious effects are seen, such as high voltage instabilities and associated variations in dosage of ions being implanted.

SUMMARY

The present disclosure thus provides a system and apparatus for generating an ion beam comprising aluminum ions from gaseous dimethylaluminum chloride (DMAC). Accordingly, the following presents a simplified summary of the disclosure in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

In accordance with one aspect of the disclosure, an ion implantation system is provided. A gaseous aluminum-based ion source material is provided, wherein an ion source is configured to receive and ionize the gaseous aluminum-based ion source material and to form an ion beam therefrom. A beamline assembly is configured to selectively transport the ion beam, and an end station is configured to accept the ion beam for implantation of ions into a workpiece.

The gaseous aluminum-based ion source material, for example, comprises, or is comprised of, dimethylaluminum chloride (DMAC). In one example, the DMAC is stored as a liquid that transitions into vapor phase at room temperature at a predetermined negative pressure (e.g., vacuum pressure). A pressurized gas bottle, for example, is configured to contain the DMAC and to provide the DMAC to the ion source. The ion source, for example, comprises an arc chamber, wherein the pressurized gas bottle is configured provide the DMAC to the arc chamber. One or more dedicated supply lines can be further provided and configured to transfer the DMAC from the pressurized gas bottle to the arc chamber. A low-pressure gas bottle, for example, is configured to contain the DMAC and to provide the DMAC to an arc chamber of the ion source as a gas via a primary gas line.

In one example, a co-gas source and a secondary gas line that is distinct and separate from the one or more dedicated supply lines are provided, wherein the co-gas source and secondary gas line are configured to supply a co-gas to the ion source. The co-gas, for example, comprises one or more of $BF_3$, $SiF_4$, $PF_3$, $PF_5$, $NF_3$, $He+F_2$ and $He+F_{2+}Ar$. The co-gas source can be a pressurized or sub-atmospheric gas source. In another example, the co-gas comprises one or more of a fluorine-containing molecule and a mixture of fluorine and one or more inert gases.

The fluorine-containing molecule and the DMAC, for example, are configured to produce a reduction in energetic carbon cross-contamination. The fluorine-containing molecule, for example, can be further configured to etch a ceramic to produce a higher beam current when running doubly-charged aluminum. In one example, the co-gas comprises the fluorine-containing molecule mixed with an inert gas.

A vacuum system can be further provided and configured to substantially evacuate one or more enclosed portions of the ion implantation system. The one or more enclosed portions of the ion implantation system, for example, can comprise the ion source.

In accordance with another example aspect, an ion source for an ion implantation system is provided. The ion source, for example, comprises an arc chamber, a DMAC source material, and one or more source material supply lines configured to transfer the DMAC source material to the arc chamber. The arc chamber, for example, is configured to ionize the DMAC source material. A pressurized gas bottle, for example, can be configured to contain the DMAC source material.

One or more co-gas supply lines, for example, can be further configured to supply a co-gas to the arc chamber. The co-gas, for example, can comprise one or more of a fluorine-containing molecule and a mixture of fluorine and one or more inert gases. In one example, the co-gas comprises one or more of $BF_3$, $SiF_4$, $PF_3$, $PF_5$, $NF_3$, $He+F_2$ and $He+F_{2+}Ar$. A vacuum system can be further configured to substantially evacuate one or more enclosed portions of the ion source.

In accordance with another example aspect of the disclosure, a method for implanting aluminum ions into a workpiece is provided. The method, for example, comprises providing an aluminum-based source material comprising DMAC to an ion source. The aluminum-based source material is ionized in the ion source, and aluminum ions are extracted from the ion source. Further, the aluminum ions from the ionized aluminum-based source material are implanted into the workpiece.

In one example, the DMAC is provided from a pressurized gas source to an arc chamber of the ion source. In another example, a co-gas is further provided to the ion source. The co-gas, for example, can comprise one or more of a fluorine-containing molecule and a mixture of fluorine and one or more inert gases, such as one or more of $BF_3$, $SiF_4$, $PF_3$, $PF_5$, $NF_3$, $He+F_2$ and $He+F_{2+}Ar$.

According to yet another example aspect of the disclosure, an ion implantation system is provided, comprising a gaseous aluminum-based ion source material. The gaseous aluminum-based ion source material, for example, comprises, or is comprised of, DMAC, wherein the DMAC is a liquid that transitions into vapor phase at room temperature. The ion implantation system, for example, further comprises an ion source configured to receive and ionize the gaseous aluminum-based ion source material and to form an ion beam therefrom. A beamline assembly, for example, is configured to selectively transport the ion beam, and an end station is configured to accept the ion beam for implantation of ions into a workpiece.

In one example, the gaseous aluminum-based ion source material is in a liquid state in a low-pressure bottle and transitions to vapor phase concurrent with an introduction to the ion source.

In accordance with a further example aspect of the disclosure, an ion source is provided, wherein the ion source comprises an arc chamber and a DMAC source comprising a DMAC source material. One or more supply lines, for example, are configured to transfer the DMAC source material from the DMAC source to the arc chamber. The DMAC source material, for example, is a liquid that transitions into vapor phase at room temperature.

In one example, the one or more supply lines comprise a dedicated gas line configured to exclusively transport the DMAC source material from the DMAC source to the arc chamber. In another example, an inert gas source comprising an inert gas is provided, wherein the one or more supply lines are further configured to transport the inert gas to the arc chamber. The one or more supply lines, for example, can comprise a single supply line configured to supply a mixture of the DMAC source material and the inert gas to the arc chamber. In another example, the DMAC source material and the inert gas are pre-mixed in a common source.

A co-gas source and one or more co-gas supply lines, for example, can be configured to supply a co-gas from the co-gas source to the arc chamber. The one or more co-gas supply lines and the one or more supply lines, for example, are distinct from one another. The co-gas, for example, comprises a fluorine-containing molecule configured to reduce energetic carbon cross contamination in the arc chamber. In one example, the fluorine-containing molecule comprises one or more of $BF_3$, $PF_3$, $PF_5$, $NF_3$, and $SiF_4$. In another example, a ceramic target is provided and positioned within the arc chamber. The ceramic target, for example, comprises aluminum, wherein the ceramic target is etched via the fluorine-containing molecule.

In another example, the co-gas is a pre-mixture of gases, wherein at least one component of the pre-mixture of gases is fluorine, wherein the fluorine is configured to reduce energetic cross contamination in the arc chamber. The pre-mixture of gases, for example, comprises fluorine plus one or more of argon and helium. For example, the pre-mixture of gases comprises one or more of $(Ar+F_2)$, $(He+F_2)$, and $(Ar+He+F_2)$.

Thus, in accordance with one example aspect, an ion implantation system for implanting aluminum ions, is provided, wherein an electrode power supply is electrically coupled to an electrode (e.g., a cathode) in an arc chamber. A process gas source containing DMAC (e.g., in a liquid state) is fluidly coupled to the arc chamber via a process gas supply line, wherein the process gas supply line is configured to selectively transfer the DMAC from the process gas source to the arc chamber in gaseous form. The electrode, for example, is configured to form a plasma from the DMAC within the arc chamber based, at least in part, on an energy (e.g., current) provided to the electrode from the electrode power supply. Thus, the DMAC is ionized or otherwise decomposed or disassociated to form at least $C_2H_3$, wherein $C_2H_3$ has a mass that approximates the mass of atomic aluminum.

In one example, a co-gas source is further provided, wherein the co-gas source contain a co-gas comprising fluorine. The fluorine, for example, can be in molecular form or in a gaseous form mixed with an inert gas. A co-gas supply line, for example, fluidly couples the co-gas source and the arc chamber, wherein the co-gas supply line is configured to selectively transfer the co-gas from co-gas source to the arc chamber. The co-gas supply line, for example, is distinct and separate from the process gas supply line. The fluorine from the co-gas source, for example, is configured to react with at least the $C_2H_3$, thereby forming $CF_x$. By forming $CF_x$, an amount of $C_2H_3$ available within the arc chamber is minimized, whereby the $CF_x$, having a different atomic mass than atomic aluminum, can be advantageously separated from aluminum ions via subsequent mass analysis.

In another example, an extraction electrode is provided and configured to extract an aluminum-based ion beam from the arc chamber based on a biasing of the extraction electrode with respect to the arc chamber. For example, the extraction electrode is positioned proximate to an extraction aperture of the arc chamber, whereby the aluminum-based ion beam is formed. A mass analyzer, for example, is further positioned downstream of the extraction electrode, whereby the mass analyzer is configured to mass analyze the aluminum-based ion beam and remove the $CF_x$, thereby defining a mass analyzed aluminum ion beam, and whereby energetic cross-contamination due to $C_2H_3$ in the mass analyzed aluminum ion beam is advantageously minimized.

In accordance with another example, a ceramic target is further positioned or otherwise provided within the arc chamber, wherein the ceramic target comprises aluminum, and wherein the fluorine is configured to etch the ceramic target to increase a beam current of the aluminum-based ion beam. For example, the aluminum-based ion beam can comprise doubly-charged aluminum ions.

To the accomplishment of the foregoing and related ends, the disclosure comprises the features hereinafter fully described and particularly pointed out in the claims. The following description and the annexed drawings set forth in detail certain illustrative embodiments of the invention. These embodiments are indicative, however, of a few of the various ways in which the principles of the invention may be employed. Other objects, advantages and novel features of the invention will become apparent from the following detailed description of the invention when considered in conjunction with the drawings.

DETAILED DESCRIPTION

Figure 1:
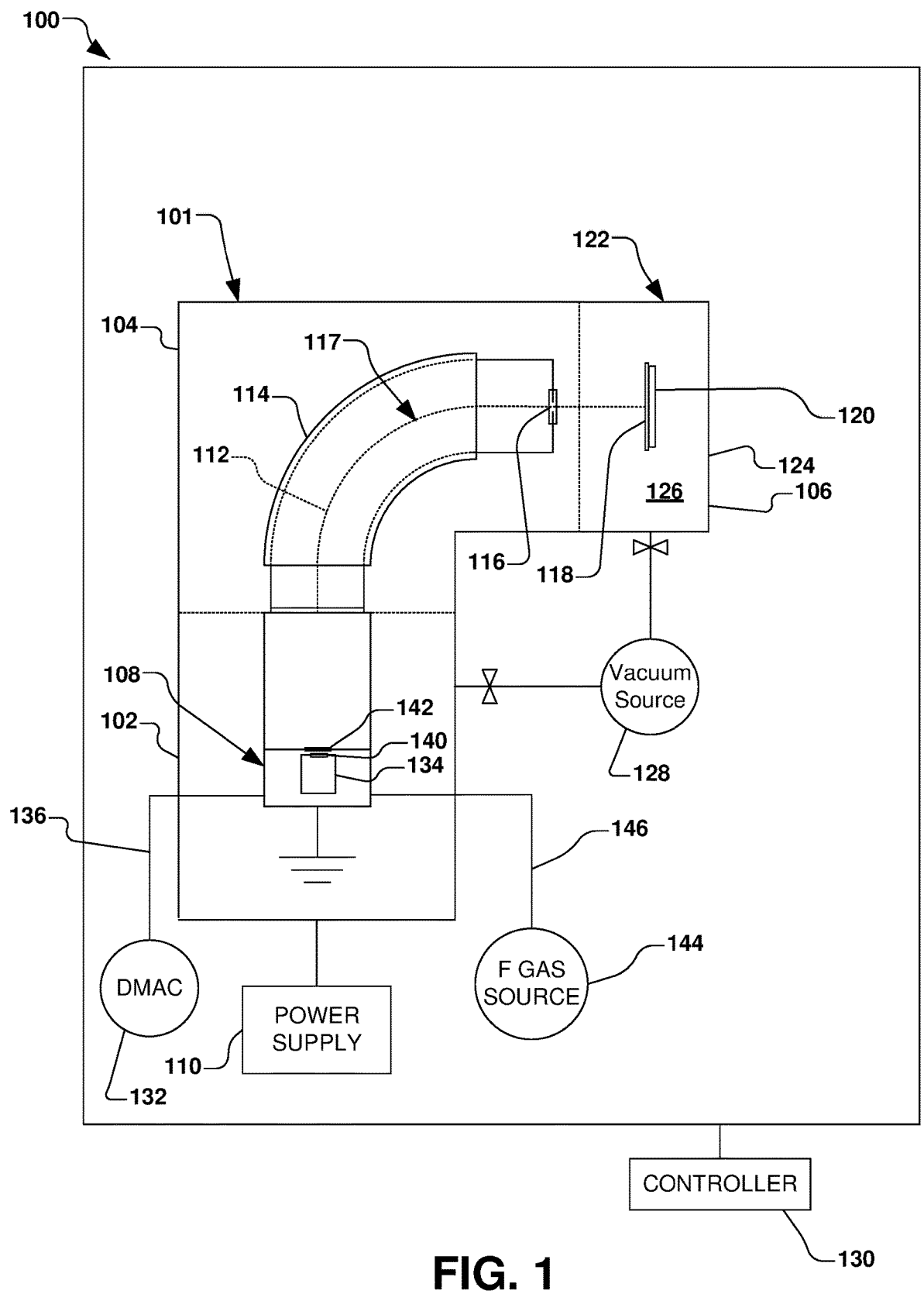
FIG. 1 is a block diagram of an exemplary vacuum system utilizing dimethylaluminum chloride as an ion source material in accordance with several aspects of the present disclosure.

The present disclosure is directed generally toward an ion implantation system and an ion source material associated therewith. More particularly, the present disclosure is directed toward components for said ion implantation system using dimethylaluminum chloride as an ion source material for producing atomic ions to electrically dope silicon, silicon carbide, or other semiconductor substrates at various temperatures. The present disclosure advantageously minimizes energetic cross-contamination of carbon in an aluminum implant when using dimethylaluminum chloride as the ion source material. Further, the present disclosure minimizes various deposits on extraction electrodes and source chamber components. The present disclosure will thus reduce associated arcing and glitching, and will further increase overall lifetimes of the ion source and associated electrodes.

Accordingly, the present invention will now be described with reference to the drawings, wherein like reference numerals may be used to refer to like elements throughout. It is to be understood that the description of these aspects are merely illustrative and that they should not be interpreted in a limiting sense. In the following description, for purposes of explanation, numerous specific details are set forth in order to provide a thorough understanding of the present invention. It will be evident to one skilled in the art, however, that the present invention may be practiced without these specific details. Further, the scope of the invention is not intended to be limited by the embodiments or examples described hereinafter with reference to the accompanying drawings, but is intended to be only limited by the appended claims and equivalents thereof.

It is also noted that the drawings are provided to give an illustration of some aspects of embodiments of the present disclosure and therefore are to be regarded as schematic only. In particular, the elements shown in the drawings are not necessarily to scale with each other, and the placement of various elements in the drawings is chosen to provide a clear understanding of the respective embodiment and is not to be construed as necessarily being a representation of the actual relative locations of the various components in implementations according to an embodiment of the invention. Furthermore, the features of the various embodiments and examples described herein may be combined with each other unless specifically noted otherwise.

It is also to be understood that in the following description, any direct connection or coupling between functional blocks, devices, components, or other physical or functional units shown in the drawings or described herein could also be implemented by an indirect connection or coupling. Furthermore, it is to be appreciated that functional blocks or units shown in the drawings may be implemented as separate features in one embodiment, and may also or alternatively be fully or partially implemented in a common feature in another embodiment.

Ion implantation is a physical process that is employed in semiconductor device fabrication to selectively implant dopant into semiconductor and/or wafer material. Thus, the act of implanting does not rely on a chemical interaction between a dopant and semiconductor material. For ion implantation, dopant atoms/molecules from an ion source of an ion implanter are ionized, accelerated, formed into an ion beam, analyzed, and swept across a wafer, or the wafer is translated through the ion beam. The dopant ions physically bombard the wafer, enter the surface and come to rest below the surface, at a depth related to their energy.

Ion sources in ion implanters typically generate the ion beam by ionizing a source material in an arc chamber, wherein a component of the source material is a desired dopant element. The desired dopant element is then extracted from the ionized source material in the form of the ion beam.

In order to gain a general understanding of the disclosure, and in accordance with one aspect of the present disclosure, FIG. 1 illustrates an exemplary vacuum system 100. The vacuum system 100 in the present example comprises an ion implantation system 101, however various other types of vacuum systems are also contemplated, such as plasma processing systems, or other semiconductor processing systems. The ion implantation system 101, for example, comprises a terminal 102, a beamline assembly 104, and an end station 106.

Generally speaking, an ion source 108 in the terminal 102 is coupled to a power supply 110 to ionize a dopant gas into a plurality of ions from the ion source to form an ion beam 112. The ion beam 112 in the present example is directed through a mass analyzer 114 (e.g., a beam-steering apparatus), and out an aperture 116 towards the end station 106. The mass analyzer 114, for example, includes a field generating component, such as a magnet, and operates to provide a field across a path 117 of the ion beam 112 so as to deflect ions from the ion beam at varying trajectories according to mass (e.g., mass-to-charge ratio). Ions traveling through the magnetic field experience a force which directs individual ions of a desired mass along the path 117 and which deflects ions of undesired mass away from the path. In the end station 106, the ion beam 112 bombards a workpiece 118 (e.g., a semiconductor such as a silicon wafer, a display panel, etc.), which is selectively clamped or mounted to a chuck 120 (e.g., an electrostatic chuck or ESC). Once embedded into the lattice of the workpiece 118, the implanted ions change the physical and/or chemical properties of the workpiece. Because of this, ion implantation is used in semiconductor device fabrication and in metal finishing, as well as various applications in materials science research.

The ion beam 112 of the present disclosure can take any form, such as a pencil or spot beam, a ribbon beam, a scanned beam, or any other form in which ions are directed toward end station 106, and all such forms are contemplated as falling within the scope of the disclosure.

According to one exemplary aspect, the end station 106 comprises a process chamber 122, such as a vacuum chamber 124, wherein a process environment 126 is associated with the process chamber. The process environment 126 generally exists within the process chamber 122, and in one example, comprises a vacuum produced by a vacuum source 128 (e.g., a vacuum pump) coupled to the process chamber and configured to substantially evacuate the process chamber. Further, a controller 130 is provided for overall control of the vacuum system 100.

The present disclosure appreciates that workpieces 118 having silicon carbide-based devices formed thereon have been found to have better thermal and electrical characteristics than silicon-based devices, in particular, in applications used in high voltage and high temperature devices, such as electric cars, etc. Ion implantation into silicon carbide, however, utilizes a different class of implant dopants than those used for silicon workpieces. In silicon carbide implants, aluminum, phosphorous, and nitrogen implants are often performed. Nitrogen implants, for example, are relatively simple, as the nitrogen can be introduced as a gas, and provides relatively easy tuning, cleanup, etc. Aluminum, however, is more difficult, as there are presently few good gaseous solutions of aluminum known.

The present disclosure contemplates that an ion source material 132, for example, is provided to an arc chamber 134 of the ion source 108 for forming the ion beam 112. The ion beam 112 is extracted through an extraction aperture 140 of the arc chamber 134 via an electrical biasing of an extraction electrode 142 associated therewith. Heretofore, there has been no material that could be safely and effectively delivered to the ion source 108 in a gaseous form in order to produce the ion beam 112 for subsequent implantation of aluminum ions. In the past, either a solid source material (not shown) has been placed in a heated vaporizer assembly (not shown), whereby the resulting gas is fed into the arc chamber 134, or a solid high-temperature ceramic (not shown) such as $Al_2O_3$ or AlN has been placed into the arc chamber where it is etched by a fluorine-based gas.

Both of these techniques, however, can have substantial limitations. For example, the time for a vaporizer to achieve a temperature needed to transition the solid material into a vapor phase can be greater than 30 minutes, which can impact tool productivity. Further, when a different dopant gas is desired to be introduced into the arc chamber, the time needed to subsequently reduce the temperature of the vaporizer such that the source material is no longer in a vapor phase can be greater than 30 minutes. This is commonly referred to as the transition time between species, whereby the transition time can reduce the productivity of the ion implanter.

Still further, when etching an aluminum oxide ($Al_2O_3$) or aluminum nitride (AlN) ceramic using a fluorine-based dopant gas (e.g., $BF_3$, $NF_3$, $PF_3$, $PF_5$), the resulting by-products of the reaction (e.g., $AlF_x$, Al, N and neutrals of AlN and $AL_2O_3$) can form an insulating coating on the extraction electrode (e.g., at a negative voltage), which, in turn, can cause a charge build up and subsequent discharging to the ion source arc slit optics plate (e.g., at a positive voltage), thus further reducing the productivity of the tool.

In order to overcome the limitations or the prior art, the ion implantation system 101 of the present disclosure provides gaseous dimethylaluminum chloride ($C_4H_{10}AlCl$, also referred to as DMAC) as the ion source material 132 to advantageously deliver an aluminum-based material into the arc chamber 134 of the ion source 108 in a gaseous form. Providing DMAC to the arc chamber 134 in a gaseous form, for example, advantageously allows for faster transition times between species (e.g., less than 5 minutes), no wait times for material warm-up and cool-down, and no insulating material forming on the extraction electrode seen in conventional systems.

The DMAC, for example, is stored in a pressurized gas bottle as a liquid that transitions into vapor phase at room temperature at a predetermined pressure (e.g., a vacuum). The ion source material 132 (e.g., DMAC), for example, is selectively delivered to the arc chamber 134 via a dedicated, primary gas line 136, as it is a highly reactive material (pyrophoric). A fluorine-containing gas source 144 (e.g., $BF_3$, $PF_3$, etc.) is selectively provided to the arc chamber 134 via a secondary gas line 146, wherein the primary gas line 136 and secondary gas line are distinct and separate gas lines. The fluorine-containing gas source 144, for example, is a molecule or a pre-mixture of gases wherein at least one component thereof is fluorine.

The inventors have observed that high beam currents (e.g., greater than approximately 30 ma) of singly-charged aluminum (Al+) can be achieved, but that beam currents of doubly-charged (Al++) are substantially lower (e.g., less than approximately 5 ma). In order to augment the production of doubly-charged aluminum, for example, a ceramic target consisting of either AlN or $Al_2O_3$ can be positioned on, or in close proximity to, a shaft comprised of a refractory metal that can be biased to a negative potential. Biasing the shaft to a negative potential, for example, generates a negative electric field that accelerates ions to the surface (e.g., increasing the ion current), which, in-turn, increases the temperature of the refractory metal shaft and the aluminum-based ceramic target. This increase in temperature, when using a fluorine-based gas molecule, thus increases the etch rate of the aluminum-based ceramic to form $AlF_x$ which is then cracked in the plasma to form AL+ and F. For example, the following reactions can occur:

$$AlN + F_2 \rightarrow AlF_3 + N_2 \quad (1), \text{ and}$$

$$Al_2O_3 + F_2 \rightarrow AlF_3 + O_2 \quad (2).$$

There is also incidental sputtering of the ceramic target to form neutrals of nitrogen, oxygen, and aluminum, whereby such neutrals can be further ionized in the plasma. The provision of an aluminum-based sputter/etch target in conjunction with DMAC and one or more of a fluorine-containing molecule (e.g., $BF_3$, $PF_3$, $PF_5$, etc.) and a pre-mix of other gases where at least one component is fluorine (e.g., $BF_3+Ar$, $He+F_2$), thus allows for lower flows of DMAC to the ion source. As such, an internal pressure of the arc chamber can be lowered (e.g., due to reduced charge exchange, longer mean free path), which can be further beneficial to the formation of doubly-charged aluminum ions.

The reaction of fluorine and hydrogen, for example, is beneficial to the production of doubly-charged aluminum, as high hydrogen levels correlate to lower doubly-charged aluminum beam currents by the reaction, $$H + F \rightarrow HF \quad (3).$$

Further, the chlorine component of DMAC will also etch the AlN and/or $Al_2O_3$ to form $AlCl_x$, as $$Al + Cl_2 \rightarrow AlCl_3 \quad (4),$$

which can then be ionized in the plasma.

In accordance with another example, a further advantage of using a fluorine-based molecule as a co-gas when running DMAC is a reduction in energetic carbon cross-contamination. The co-gas may comprise one or more of a fluorine-containing molecule and a mixture of fluorine and one or more inert gases. In one example, the co-gas comprises one or more of $BF_3$, $SiF_4$, $PF_3$, $PF_5$, $NF_3$, $He+F_2$ (sometimes referred to as $HeF_2$), and $He+F_{2+}Ar$ (sometimes referred to as $HeF_2Ar$). For example, the addition of a fluorine-based molecule (e.g., $BF_3$) or a pre-mixture of other gases where at least one component is fluorine (e.g., $He+F_2$) to the provision of DMAC has been observed to reduce the contamination level by approximately 50% from 2.05e17 to 1e17, as seen when comparing an 85V biased electrode AMU spectra 202 to an 85V biased electrode with the provision of $BF_3$ AMU spectra 204, as illustrated in the graph 200 of FIG. 2.

Figure 2:
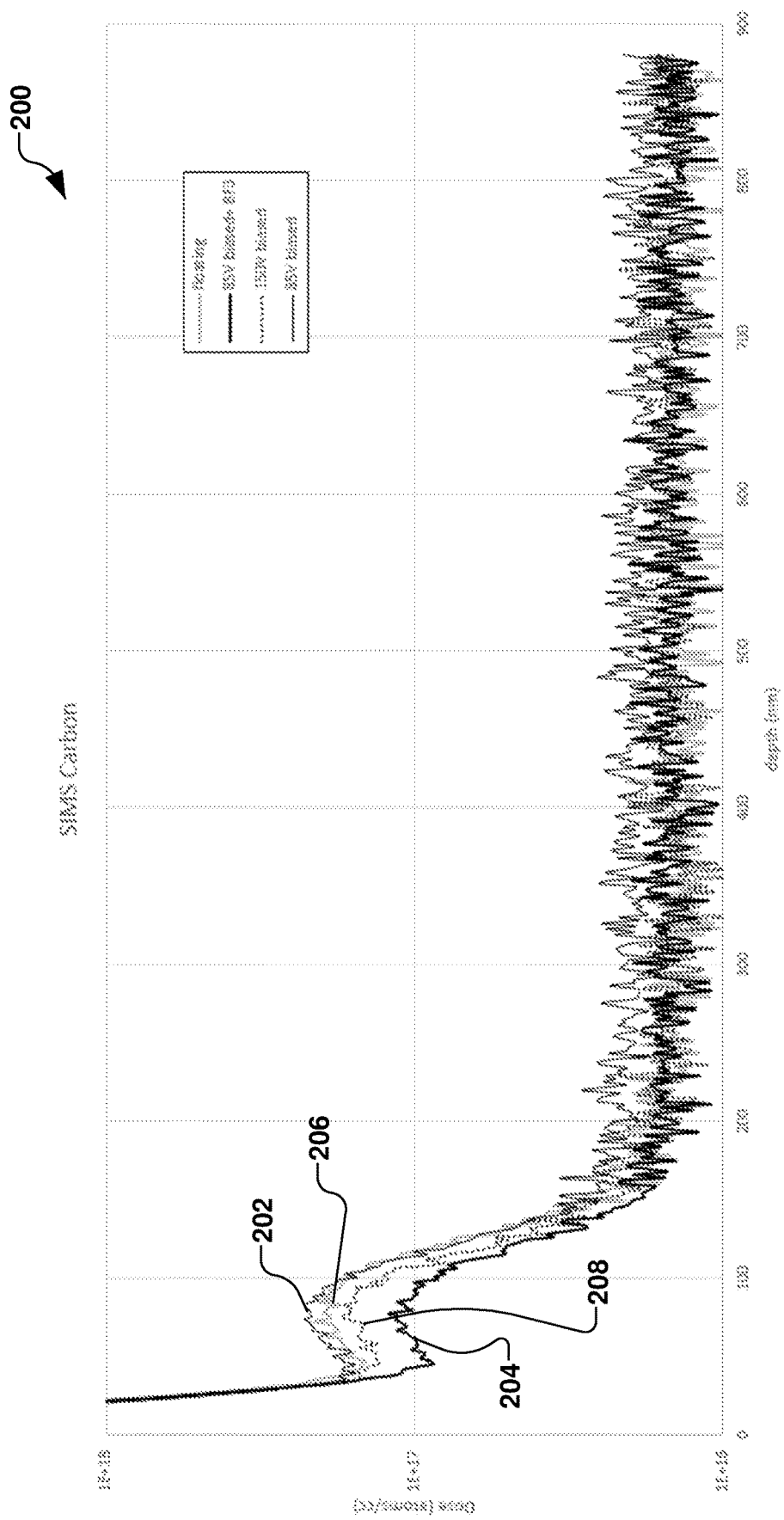
FIG. 2 is a graph illustrating various spectra of an aluminum ion beam according to several examples.
Figure 3:
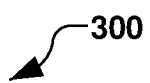
FIG. 3 is a chart illustrating a comparison of various spectra values according to several examples.

Based, at least in part on the comparisons of the AMU spectras 202, 204, 206, and 208 of FIG. 2 and AMU spectra value comparisons 300 shown in FIG. 3, the present disclosure appreciates potential mechanisms for such variations. For example, fluorine (F) can be scavenging hydrogen (H) atoms from carbon (C), thus reducing a formation of $C_2H_x+$ species (e.g., where $C_2H_3$ is approximately the same atomic mass as Al+). In other examples, fluorine (F) can also be breaking carbon-to-carbon bonds (C—C), or following reaction can occur to form $CF_x$:

$$C_2H_3 + 5F \rightarrow 2CF + 3HF \quad (5).$$

Figure 4:
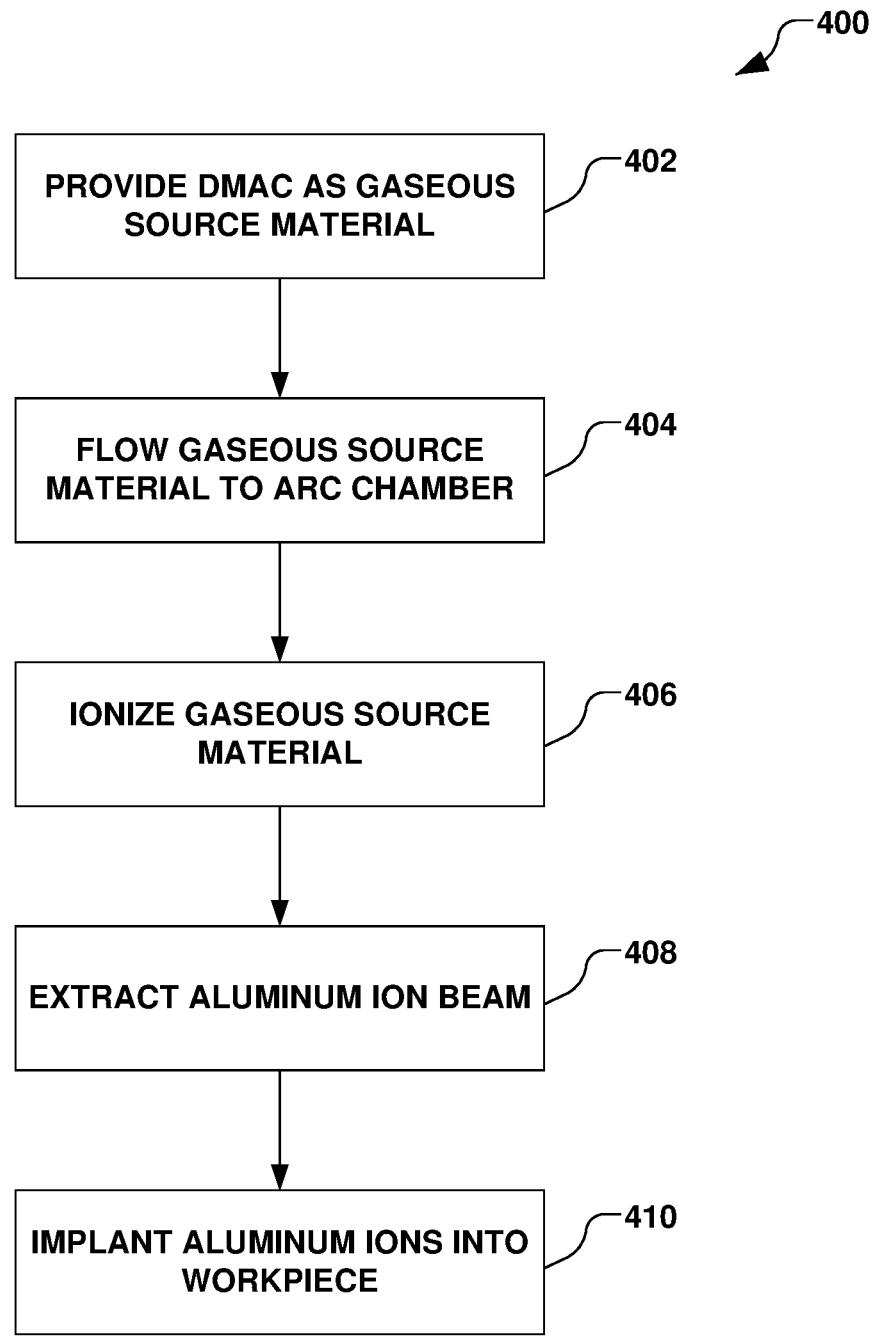
FIG. 4 illustrates an exemplary method for implanting aluminum ions into a workpiece using dimethylaluminum chloride as a gaseous ion source material.

FIG. 4 illustrates an exemplary method 400 for implanting aluminum ions into a workpiece. It should be further noted that while exemplary methods are illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the methods may be implemented in association with the systems illustrated and described herein as well as in association with other systems not illustrated.

In accordance with one exemplary aspect, in act 402 of FIG. 4, a gaseous ion source material is provided in the form of dimethylaluminum chloride (DMAC). The gaseous ion source material, for example, may be provided in a low pressure bottle (e.g., approximately 10-15 torr), whereby the DMAC is flowed from the low pressure bottle as a gas to an arc chamber of an ion source in act 404. In act 406, the ion source material comprising DMAC is ionized in the ion source to produce aluminum ions. In act 408, the aluminum ions are extracted from the ion source to form an ion beam comprising the aluminum ions, and in act 410, the aluminum ions are implanted into a workpiece.

Although the invention has been shown and described with respect to a certain embodiment or embodiments, it should be noted that the above-described embodiments serve only as examples for implementations of some embodiments of the present invention, and the application of the present invention is not restricted to these embodiments. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application. Accordingly, the present invention is not to be limited to the above-described embodiments, but is intended to be limited only by the appended claims and equivalents thereof.

The invention claimed is:

1. An ion implantation system for implanting aluminum ions, the ion implantation system comprising:
   an electrode power supply;
   an arc chamber comprising an electrode, wherein the electrode is electrically coupled to the electrode power supply;
   a process gas source containing dimethylaluminum chloride (DMAC);
   a process gas supply line fluidly coupled to the process gas source and the arc chamber, wherein the process gas supply line is configured to selectively transfer the DMAC from the process gas source to the arc chamber, wherein the electrode is configured to form a plasma from the DMAC within the arc chamber based, at least in part, on an energy provided to the electrode from the electrode power supply, thereby decomposing the DMAC to form at least $C_2H_3$ having a mass approximating atomic aluminum;
   a co-gas source containing a co-gas comprising fluorine; and
   a co-gas supply line fluidly coupled to the co-gas source and the arc chamber, wherein the co-gas supply line is configured to selectively transfer the co-gas from co-gas source to the arc chamber, wherein the co-gas supply line is distinct from the process gas supply line, and wherein the fluorine is configured to react with at least the $C_2H_3$, thereby forming $CF_x$ and minimizing an amount of $C_2H_3$ available within the arc chamber.

2. The ion implantation system of claim 1, wherein the process gas source maintains the DMAC in a liquid state.

3. The ion implantation system of claim 2, wherein the process gas source comprises a pressurized gas bottle configured to contain the DMAC.

4. The ion implantation system of claim 1, wherein the co-gas comprises a fluorine-containing molecule.

5. The ion implantation system of claim 4, wherein the fluorine-containing molecule comprises $BF_3$, $SiF_4$, $PF_3$, $PF_5$, or $NF_3$.

6. The ion implantation system of claim 1, wherein the co-gas comprises an inert gas mixed with fluorine gas ($F_2$) in a predetermined concentration.

7. The ion implantation system of claim 6, wherein the inert gas comprises one or more of helium and argon.

8. The ion implantation system of claim 1, wherein the co-gas source comprises one or more pressurized gas sources.

9. The ion implantation system of claim 1, further comprising:
   an extraction electrode configured to extract an aluminum-based ion beam from the arc chamber based on a biasing of the extraction electrode with respect to the arc chamber; and
   a mass analyzer positioned downstream of the extraction electrode, wherein the mass analyzer is configured to mass analyze the aluminum-based ion beam and remove the $CF_x$, thereby defining a mass analyzed aluminum ion beam, whereby energetic cross-contamination due to $C_2H_3$ in the mass analyzed aluminum ion beam is minimized.

10. The ion implantation system of claim 9, further comprising a ceramic target positioned within the arc chamber, wherein the ceramic target comprises aluminum, and wherein the fluorine is configured to etch the ceramic target.

11. The ion implantation system of claim 10, wherein the aluminum-based ion beam comprises doubly-charged aluminum ions.

12. A system for implanting aluminum ions into a workpiece, the system comprising:
an ion source comprising:
an arc chamber comprising one or more electrodes operably coupled to an electrode power supply, wherein the arc chamber further comprises an extraction aperture;
a process gas source containing dimethylaluminum chloride (DMAC);
a process gas supply line fluidly coupling the process gas source to the arc chamber, wherein the process gas supply line is configured to selectively transfer the DMAC from the process gas source to the arc chamber, wherein the one or more electrodes are configured to form a plasma from the DMAC within the arc chamber based, at least in part, on an energy provided to the electrode from the electrode power supply, thereby decomposing the DMAC to form at least $C_2H_3$ having a mass approximating atomic aluminum;
a co-gas source containing a co-gas comprising fluorine; and
a co-gas supply line fluidly coupling the co-gas source to the arc chamber, wherein the co-gas supply line is configured to selectively transfer the co-gas from co-gas source to the arc chamber, wherein the co-gas supply line is distinct from the process gas supply line, and wherein the fluorine is configured to react with at least the $C_2H_3$, thereby forming $CF_x$ and minimizing an amount of $C_2H_3$ available within the arc chamber;
an extraction electrode proximate to the extraction aperture of the arc chamber, wherein the extraction electrode is configured to extract an aluminum-based ion beam from the arc chamber based on a biasing of the extraction electrode with respect to the arc chamber; and
a mass analyzer positioned downstream of the extraction aperture, wherein the mass analyzer is configured to mass analyze the aluminum-based ion beam and remove the $CF_x$, thereby defining a mass analyzed aluminum ion beam, whereby energetic cross-contamination due to $C_2H_3$ in the mass analyzed aluminum ion beam is minimized.

13. The system of claim 12, wherein the process gas source comprises a pressurized gas bottle configured to contain the DMAC.

14. The system of claim 12, wherein the co-gas comprises a one or more of $BF_3$, $SiF_4$, $PF_3$, $PF_5$, or $NF_3$.

15. The system of claim 12, wherein the co-gas comprises an inert gas mixed with fluorine gas ($F_2$) in a predetermined concentration.

16. The system of claim 12, further comprising a ceramic target positioned within the arc chamber, wherein the ceramic target comprises aluminum, and wherein the fluorine is configured to etch the ceramic target and to increase a beam current of the aluminum-based ion beam.

17. The system of claim 16, wherein the aluminum-based ion beam comprises doubly-charged aluminum ions.

18. A system for implanting aluminum ions into a workpiece, the system comprising:
an ion source comprising:
an arc chamber comprising an extraction aperture;
one or more electrodes electrically coupled to an electrode power supply;
a ceramic target positioned within the arc chamber, wherein the ceramic target comprises aluminum;
a process gas source containing dimethylaluminum chloride (DMAC) in a liquid form;
a process gas supply line fluidly coupling the process gas source to the arc chamber, wherein the process gas supply line is configured to selectively transfer the DMAC from the process gas source to the arc chamber in a gaseous form, wherein the one or more electrodes are configured to form a plasma from the DMAC within the arc chamber based, at least in part, on an energy provided to the one or more electrodes from the electrode power supply, thereby decomposing the DMAC to form at least $C_2H_3$ having a mass approximating atomic aluminum;
a co-gas source containing a co-gas comprising fluorine; and
a co-gas supply line fluidly coupling the co-gas source to the arc chamber, wherein the co-gas supply line is configured to selectively transfer the co-gas from co-gas source to the arc chamber, wherein the co-gas supply line is distinct from the process gas supply line, and wherein the fluorine is configured to react with at least the $C_2H_3$, thereby forming $CF_x$ and minimizing an amount of $C_2H_3$ available within the arc chamber, and wherein the fluorine is configured to etch the ceramic target;
an extraction electrode proximate to the extraction aperture of the arc chamber, wherein the extraction electrode is configured to extract an aluminum-based ion beam from the arc chamber based on a biasing of the extraction electrode with respect to the arc chamber; and
a mass analyzer positioned downstream of the extraction aperture, wherein the mass analyzer is configured to mass analyze the aluminum-based ion beam and remove the $CF_x$, thereby defining the aluminum ion beam, whereby energetic cross-contamination due to $C_2H_3$ in the aluminum ion beam is minimized.

19. The system of claim 16, wherein the fluorine is configured to etch the ceramic target to increase a beam current of the aluminum-based ion beam.

20. The system of claim 16, wherein the ceramic target comprises $Al_2O_3$ or AlN.

* * * * *